United States Patent
Weiss et al.

(10) Patent No.: US 6,518,895 B1
(45) Date of Patent: Feb. 11, 2003

(54) APPROXIMATE PREFIX CODING FOR DATA COMPRESSION

(75) Inventors: Shlomo Weiss, Petach Tikva (IL); Roman Tsikel, Rishon Lezion (IL)

(73) Assignee: Ramot University Authority for Applied Research and Industrial Development Ltd., Tel Aviv (IL)

( * ) Notice: Subject to any disclaimer, the term of this patent is extended or adjusted under 35 U.S.C. 154(b) by 0 days.

(21) Appl. No.: 09/987,799

(22) Filed: Nov. 16, 2001

(51) Int. Cl.$^7$ ................................................ H03M 7/40
(52) U.S. Cl. ........................................................ 341/67
(58) Field of Search .............................. 341/67, 65, 107

(56) References Cited

U.S. PATENT DOCUMENTS

| | | | |
|---|---|---|---|
| 5,634,092 A | 5/1997 | Stokes | 395/118 |
| 5,864,364 A | 1/1999 | Ohyama et al. | 348/211 |
| 5,973,626 A | * 10/1999 | Berger | 341/107 |

FOREIGN PATENT DOCUMENTS

| | | |
|---|---|---|
| EP | 0 581 590 A2 | 2/1994 |
| EP | 0 616 200 A1 | 9/1994 |

OTHER PUBLICATIONS

D. A. Huffman, "A method for the construction of minimum redundancy codes", *Proc. IRE* vol. 40 No. 9 pp. 1098–1101, Sep. 1952).

P. Deutsch, "DEFLATE compressed data format specification version 1.3", *Request for Comments No. 1951, Network Working Group*, May 1996).

J. Ziv and A. Lempel, "A universal algorithm for sequential data compression", *IEEE Transactions on Information Theory* vol. 23 No. 3 pp. 337–343, May 1977.

E. S. Schwartz and B. Kallick, "Generating a canonical prefix coding", *Communications of the ACM* vol. 7 No. 3 pp. 166–169, Mar. 1964).

S. Chang and D. G. Messerschmitt, "Designing high–throughput VLC decoders Part I–concurrent VSLI architectures", *IEEE Transactions on Circuits and Systems for Video Technology* vol. 2 No. 2 pp. 187–196, Jun. 1992.

S. M. Lei and M. T. Sun, "An entropy coding system for digital HDTV applications", *IEEE Transactions on Circuits and Systems for Video Technology* vol. 1 No. 1 pp. 147–155, Mar. 1991).

J. H. Jeon et al., in "A fast variable–length decoder using plane separation", *IEEE Transactions on Circuits and Systems for Video Technology* vol. 10 No. 5 pp. 806–812, Aug. 2000).

* cited by examiner

Primary Examiner—Brian Young
(74) Attorney, Agent, or Firm—Mark M. Friedman

(57) ABSTRACT

A method of compressing a dataset of distinct symbols, such as binary instructions, that all have a common length. The instructions are ranked by frequency. The most common symbols are classified according to a successive-powers-of-two class size scheme, and are compressed as concatenations of respective class codes and respective symbol codes. A literal class code is prepended to the remaining symbols. The associated codebook is a list of the classified symbols in rank order. To decompress the compressed symbols, the compressed symbols are parsed into their class codes and symbol codes, and the symbol codes are used as lookup indices for the codebook. The scope of the invention includes a computer with a fixed-instruction-length processor and one or more instruction storage areas where compressed instructions are stored and decompressed for execution.

21 Claims, 10 Drawing Sheets

| Number | File name | Left instruction half | | | Right instruction half | | |
|---|---|---|---|---|---|---|---|
| | | $a$ | $b$ | Norm of residuals | $a$ | $b$ | Norm of residuals |
| 1 | ammp00 | -1.0936 | 4.4396 | 2.7975 | -0.89659 | 3.8538 | 2.2938 |
| 2 | applu00 | -1.0764 | 4.7911 | 2.2732 | -0.76745 | 3.9760 | 2.0412 |
| 3 | apsi00 | -1.1010 | 4.8537 | 1.9774 | -0.82442 | 4.1215 | 1.6197 |
| 4 | art00 | -1.0020 | 3.9112 | 2.5186 | -0.98585 | 3.8724 | 3.2567 |
| 5 | bzip200 | -0.9766 | 3.7872 | 2.5503 | -0.98956 | 3.8060 | 3.9903 |
| 6 | crafty00 | -1.1407 | 4.7373 | 4.6287 | -0.98800 | 4.2152 | 3.0258 |
| 7 | eon00 | -1.0645 | 4.5351 | 1.2957 | -1.10300 | 4.6679 | 2.5461 |
| 8 | equake00 | -0.9958 | 3.9063 | 2.5640 | -0.94936 | 3.7919 | 3.2855 |
| 9 | facerec00 | -1.0611 | 4.6189 | 1.6633 | -0.94826 | 4.3648 | 1.7252 |
| 10 | fma3d00 | -1.0938 | 5.2782 | 2.4104 | -0.90595 | 4.6348 | 1.2180 |
| 11 | galgel00 | -1.0650 | 4.7168 | 1.5394 | -0.94955 | 4.4445 | 1.5125 |
| 12 | gap00 | -1.1008 | 4.7734 | 2.2592 | -1.06370 | 4.6760 | 2.2790 |
| 13 | gcc00 | -0.9978 | 4.9365 | 2.5784 | -1.06210 | 5.0660 | 3.6247 |
| 14 | gzip00 | -1.0194 | 3.9672 | 2.6562 | -1.00310 | 3.8839 | 3.2668 |
| 15 | lucas00 | -1.0515 | 4.5602 | 1.4911 | -0.95540 | 4.3535 | 1.6865 |
| 16 | mcf00 | -1.0647 | 3.9834 | 4.7579 | -1.06230 | 3.9495 | 5.6920 |
| 17 | mesa00 | -0.8188 | 4.3815 | 5.2259 | -0.94845 | 4.5032 | 2.3341 |
| 18 | mgrid00 | -1.0712 | 4.5865 | 1.3346 | -0.96699 | 4.3614 | 1.7393 |
| 19 | parser00 | -1.0620 | 4.2894 | 2.6298 | -1.11690 | 4.3852 | 3.8723 |
| 20 | perlbmk00 | -1.0539 | 4.8644 | 4.4392 | -1.05560 | 4.7524 | 3.0584 |
| 21 | sixtrack00 | -1.3366 | 6.0414 | 3.7830 | -0.82434 | 4.5780 | 3.9573 |
| 22 | swim00 | -1.0556 | 4.5550 | 1.4965 | -0.96312 | 4.3557 | 1.6802 |
| 23 | twolf00 | -1.1723 | 4.8160 | 4.2071 | -0.91931 | 4.0420 | 2.4522 |
| 24 | vortex00 | -1.1256 | 5.1308 | 5.5010 | -1.16220 | 5.0634 | 4.5627 |
| 25 | vpr00 | -1.0694 | 4.3944 | 3.7250 | -1.00180 | 4.1667 | 3.2305 |
| 26 | wupwise00 | -1.0641 | 4.5772 | 1.4580 | -0.97229 | 4.3852 | 1.7985 |

FIG. 2

| Number | File name | Average code length 1KB–16KB codebook memory | | | | |
|---|---|---|---|---|---|---|
| | | 1KB | 2KB | 4KB | 8KB | 16KB |
| 1 | ammp00 | 9.8256 | 9.5200 | 9.2784 | 9.0880 | 8.9344 |
| 2 | applu00 | 11.5264 | 11.2080 | 10.9584 | 10.6896 | 10.4384 |
| 3 | apsi00 | 11.1824 | 10.9024 | 10.6560 | 10.4304 | 10.2352 |
| 4 | art00 | 9.4272 | 9.1424 | 8.9136 | 8.6864 | 8.5136 |
| 5 | bzip200 | 9.0080 | 8.7280 | 8.5056 | 8.2752 | 8.0960 |
| 6 | crafty00 | 9.0224 | 8.7504 | 8.4752 | 8.2576 | 8.1184 |
| 7 | eon00 | 9.3664 | 9.1088 | 8.9056 | 8.7424 | 8.6272 |
| 8 | equake00 | 9.5776 | 9.2928 | 9.0608 | 8.8544 | 8.6864 |
| 9 | facerec00 | 10.6624 | 10.3552 | 10.0992 | 9.8864 | 9.7104 |
| 10 | mfa3d00 | 9.1696 | 8.8912 | 8.6944 | 8.5104 | 8.3744 |
| 11 | galgel00 | 10.7088 | 10.3856 | 10.1232 | 9.9120 | 9.7312 |
| 12 | gap00 | 9.4176 | 9.1056 | 8.8720 | 8.6736 | 8.5392 |
| 13 | gcc00 | 9.4672 | 9.1664 | 8.9280 | 8.7104 | 8.5648 |
| 14 | gzip00 | 8.8416 | 8.5536 | 8.3296 | 8.1104 | 7.9424 |
| 15 | lucas00 | 10.6544 | 10.3472 | 10.0880 | 9.8784 | 9.7056 |
| 16 | mcf00 | 8.5680 | 8.2848 | 8.0704 | 7.8416 | 7.6800 |
| 17 | mesa00 | 8.8816 | 8.6928 | 8.4544 | 8.2496 | 8.0272 |
| 18 | mgrid00 | 10.4352 | 10.1040 | 9.8544 | 9.6368 | 9.4624 |
| 19 | parser00 | 8.8832 | 8.5824 | 8.3408 | 8.1360 | 7.9984 |
| 20 | perlbmk00 | 9.0624 | 8.7984 | 8.5584 | 8.3440 | 8.2048 |
| 21 | sixtrack00 | 9.0576 | 8.7968 | 8.6016 | 8.4208 | 8.2880 |
| 22 | swim00 | 10.5136 | 10.1920 | 9.9408 | 9.7232 | 9.5520 |
| 23 | twolf00 | 9.3456 | 9.0416 | 8.7776 | 8.5632 | 8.4176 |
| 24 | vortex00 | 9.1440 | 8.8240 | 8.5376 | 8.2992 | 8.1760 |
| 25 | vpr00 | 9.7312 | 9.3936 | 9.1280 | 8.8912 | 8.7360 |
| 26 | wupwise00 | 10.4512 | 10.1232 | 9.8784 | 9.6560 | 9.4832 |
| Maximum | | 11.5264 | 11.2080 | 10.9584 | 10.6896 | 10.4384 |
| 3rd quartile (75%) | | 10.4512 | 10.1232 | 9.8784 | 9.6560 | 9.4832 |
| Median | | 9.4224 | 9.1256 | 8.9096 | 8.6984 | 8.5520 |
| 1st quartile (25%) | | 9.0576 | 8.7968 | 8.5376 | 8.2992 | 8.1760 |
| Minimum | | 8.5680 | 8.2848 | 8.0704 | 7.8416 | 7.6800 |

FIG. 4

| Number | File Name | $\Delta L = L_{av}(\text{Class}) - L_{av}(\text{Huffman})$ bits ||||| 
|---|---|---|---|---|---|---|
| | | 1KB | 2KB | 4KB | 8KB | 16KB |
| 1 | ammp00 | 0.011 | 0.017 | 0.020 | 0.020 | 0.024 |
| 2 | applu00 | 0.016 | 0.017 | 0.014 | 0.022 | 0.022 |
| 3 | apsi00 | 0.012 | 0.024 | 0.019 | 0.020 | 0.020 |
| 4 | art00 | 0.019 | 0.012 | 0.020 | 0.014 | 0.014 |
| 5 | bzip200 | 0.017 | 0.016 | 0.020 | 0.017 | 0.019 |
| 6 | crafty00 | 0.014 | 0.011 | 0.020 | 0.019 | 0.024 |
| 7 | eon00 | 0.017 | 0.016 | 0.022 | 0.022 | 0.028 |
| 8 | equake00 | 0.017 | 0.012 | 0.017 | 0.016 | 0.019 |
| 9 | facerec00 | 0.017 | 0.011 | 0.022 | 0.016 | 0.025 |
| 10 | fma3d00 | 0.009 | 0.006 | 0.008 | 0.011 | 0.009 |
| 11 | galgel00 | 0.014 | 0.014 | 0.019 | 0.017 | 0.024 |
| 12 | gap00 | 0.038 | 0.033 | 0.038 | 0.036 | 0.040 |
| 13 | gcc00 | 0.028 | 0.024 | 0.032 | 0.027 | 0.036 |
| 14 | gzip00 | 0.017 | 0.014 | 0.017 | 0.017 | 0.016 |
| 15 | lucas00 | 0.019 | 0.011 | 0.020 | 0.012 | 0.025 |
| 16 | mcf00 | 0.019 | 0.009 | 0.025 | 0.012 | 0.020 |
| 17 | mesa00 | 0.009 | 0.020 | 0.017 | 0.024 | 0.032 |
| 18 | mgrid00 | 0.019 | 0.011 | 0.022 | 0.014 | 0.019 |
| 19 | parser00 | 0.019 | 0.016 | 0.022 | 0.014 | 0.019 |
| 20 | perlbmk00 | 0.009 | 0.011 | 0.019 | 0.014 | 0.019 |
| 21 | sixtrack00 | 0.019 | 0.016 | 0.024 | 0.024 | 0.024 |
| 22 | swim00 | 0.017 | 0.009 | 0.020 | 0.011 | 0.020 |
| 23 | twolf00 | 0.008 | 0.014 | 0.016 | 0.014 | 0.019 |
| 24 | vortex00 | 0.011 | 0.012 | 0.017 | 0.020 | 0.024 |
| 25 | vpr00 | 0.009 | 0.004 | 0.014 | 0.009 | 0.011 |
| 26 | wupwise00 | 0.019 | 0.011 | 0.022 | 0.012 | 0.017 |
| Maximum | | 0.038 | 0.033 | 0.038 | 0.036 | 0.040 |
| Median | | 0.017 | 0.013 | 0.020 | 0.016 | 0.020 |
| Minimum | | 0.008 | 0.004 | 0.008 | 0.009 | 0.009 |

FIG. 5

APPROXIMATE PREFIX CODING FOR DATA COMPRESSION

FIELD AND BACKGROUND OF THE INVENTION

The present invention relates to a method of compressing a dataset and, more particularly, to an approximate method of compressing and decompressing fixed length executable code and to a computer that executes such code.

The Huffman code (D. A. Huffman, "A method for the construction of minimum redundancy codes", *Proc. IRE* vol. 40 no. 9 pp. 1098–1101, September 1952), also called variable-length code or prefix code because of two of its main properties, has been the subject of active research since its invention almost fifty years ago.

The Huffman algorithm sorts the symbols in probability order. Then the two symbols with the lowest probability are joined by a parent node. The probability of the parent node is the sum of the probabilities of the children of the parent node. This procedure continues recursively until a tree is built for all symbols. Each left branch of the tree is assigned a zero bit, and each right branch of the tree is assigned a one bit. The code of a symbol is the sequence of bits obtained by descending from the root of the tree to that symbol.

The average code length $L_{av}$ is defined as $$L_{av} = \sum_{i=1}^{n} p_i l_i \quad (1)$$

where n is the number of distinct symbols, $p_i$ is the probability of symbol i, and $l_i$ is the code length (in bits) assigned to symbol i. Consider, for example, the following string:
"ABCDEFGABCDEFGABCDEABCDEABCD-ABCABCABABABA BABABABABABABABABABA-BABABABABABABABABAA AAAAAAAAAAAAAAAAAA"
This string has seven distinct symbols: "A", "B", "C", "D", "E", "F", and "G". There are 50 "A"s, 30 "B"s, 7 "C"s, 5 "D"s, 4 "E"s, 2 "F"s and 2 "G"s in the string. The respective probabilities of the seven distinct symbols therefore are 0.5, 0.3, 0.07, 0.05, 0.04, 0.02 and 0.02. With seven distinct symbols, it would take three bits per symbol to encode this string if all symbols were of equal length, i.e., uncompressed. FIG. 1 shows the Huffman tree for this string and the code assigned to each symbol. The code has the prefix property: no code is the prefix of another code. From equation (1), the average code length is 1.94 bits.

A theoretical aspect of the Huffman code that has been investigated extensively is the redundancy of prefix coding. Another topic that has received considerable attention is the efficient implementation of prefix coding and decoding. Compression based on prefix coding is implemented in software in several popular utilities. The DEFLATE specification (P. Deutsch, "DEFLATE compressed data format specification version 1.3", *Request for Comments No 1951, Network Working Group*, May 1996), for example, that is used by programs such as gzip, defines a format for data compression using a combination of the LZ77 algorithm (J. Ziv and A. Lempel, "A universal algorithm for sequential data compression", *IEEE Transactions on Information Theory* vol. 23 no. 3 pp. 337–343, May 1977) and Huffman coding. The DEFLATE specification uses canonical coding (E. S. Schwartz and B. Kallick, "Generating a canonical prefix coding", *Communications of the ACM* vol. 7 no. 3 pp. 166–169, March 1964), which helps in two ways. First, the actual codebook used for compression need not be transmitted to the decompressor: the codebook is completely defined by the sequence of bit lengths of the codes for each symbol in alphabet order. Second, canonical coding improves decompression performance by using a set of decoding tables instead of a Huffman tree.

Hardware implementations of Huffman coding (S. Chang and D. G. Messerschmitt, "Designing high-throughput VLC decoders Part I—concurrent VSLI architectures", *IEEE Transactions on Circuits and Systems for Video Technology* vol. 2 no. 2 pp. 187–196, June 1992; S. M. Lei and M. T. Sun, "An entropy coding system for digital HDTV applications", *IEEE Transactions on Circuits and Systems for Video Technology* vol. 1 no. 1 pp. 147–155, March 1991) are used in real-time applications such as high-definition television (HDTV). J. H. Jeon et al., in "A fast variable-length decoder using plane separation", *IEEE Transactions on Circuits and Systems for Video Technology* vol. 10 no. 5 pp. 806–812, August 2000), proposed a variant of the Lei and Sun decoder that considerably shortens processing time. B. J. Shieh et al., in "A high-throughput memory-based VLC decoder with codeword boundary prediction", *IEEE Transactions on Circuits and Systems for Video Technology* vol. 10 no. 8 pp. 1514–1521, December 2000), described the design of a prefix decoder with codeword boundary prediction. The decompressor predicts the codeword length before the codeword has been fully decoded. The predicted codeword length is used to enhance parallel decoding.

Approximations of Huffman coding also are known. These approximations run faster than true Huffman coding, at the expense of somewhat less efficient compression. The key idea behind the concept of approximate coding is to partition symbols into groups such that all the symbols in the same group are assigned codes with the same length. These groups have been termed sets, packages or classes by different investigators. An approximate Huffman-style coding method (T. M. Kemp et al., "A decompression core for PowerPC, *IBM Journal of Research and Development* vol. 42 no. 6 pp. 807–812, November 1998) has been implemented in IBM's PowerPC 405. A high performance PLA-based decompressor architecture for class-based code has been proposed by S. Weiss and S. Beren in "HW/SW partitioning of an embedded instruction memory decompressor," *Proc. Int'l Symposium on Hardware/Software Codesign*, pp. 36–41, Copenhagen, Denmark, April 2001.

Early computer architectures (e.g., IBM 360/370, VAX, Intel x86) were designed with variable-length instructions to minimize program space, because of the expense of program memory. By contrast, many RISC architectures designed during the 1980's (e.g., Alpha, PowerPC, Sparc) have fixed-length 32-bit instructions. At the expense of reduced object code density, the use of fixed-length instructions simplifies instruction-level parallel processing and streamlines pipelined hardware design. In embedded system-on-a-chip devices, however, in which the program memory takes up a substantial portion of the chip resources and cost, the tradeoff between object code density and execution efficiency is closer to the pre-RISC situation, and it is advantageous to save resources by compressing the instructions.

The primary requirements for a compression/decompression method and the associated embedded instruction memory decompressor for a system-on-a-chip device are:

1. Efficient compression
2. Coding that facilitates high-performance decompression hardware
3. A small codebook Efficient compression depends on the choice of the alphabet. Splitting 32-bit instructions into instruction halves rather than bytes produces a large alphabet of $2^{16}$ symbols, but creates an opportunity for more efficient compression. With a large alphabet, the second and third requirements listed above can be achieved by using a form of approximate prefix coding that simplifies decompression and reduces the codebook size.

The approximations of Huffman coding that have been implemented heretofore use ad hoc methods for class partitioning. There is thus a widely recognized need for, and it would be highly advantageous to have, an approximate Huffman coding method that is based on a systematic way of constructing classes.

SUMMARY OF THE INVENTION

According to the present invention there is provided a method of compressing a dataset that includes a number N of distinct symbols, all of the symbols having a common length, including the steps of: (a) ranking the symbols by frequency, thereby assigning to each symbol a respective rank i; (b) selecting a number Q of classes; (c) selecting Q distinct class codes $c_j$ indexed by an index j such that $1 \leq j \leq Q$; and (d) for each symbol: if the rank i of the each symbol is such that $2^{q-1} \leq i \leq 2^q - 1$ for an integer $q \leq Q$: (i) assigning the class code $c_q$ to the each symbol, (ii) assigning a respective symbol code to the each symbol, and (iii) replacing at least one occurrence of the each symbol in the dataset with a concatenation of $c_q$ and the symbol code of the each symbol, thereby providing a compressed dataset.

According to the present invention there is provided a method of operating a processor, including the steps of: (a) providing a program that includes a plurality of distinct instructions, all of the instructions having a common length; (b) ranking the instructions by frequency, thereby assigning to each instruction a respective rank i; (c) selecting a number Q of classes; (d) selecting Q distinct class codes $c_j$ indexed by an index j such that $1 \leq j \leq Q$; (e) for each instruction: if the rank i of the each instruction is such that $2^{q-1} \leq i \leq 2^q - 1$ for an integer $q \leq Q$: (i) assigning the class code $c_q$ to the each instruction, (ii) assigning a respective instruction code to the each instruction, and (iii) replacing at least one occurrence of the each instruction in the program with a concatenation of $c_q$ and the instruction code of the each instruction, thereby providing a compressed program; (f) storing the compressed program in a program memory; (g) for at least one concatenation: (i) retrieving the concatenation from the program memory, (ii) decompressing the concatenation, thereby providing a decompressed instruction, and (iii) executing the decompressed instruction, using the processor.

According to the present invention there is provided a computer, including: (a) a processor; (b) at least one program memory for storing a plurality of compressed instructions, each compressed instruction including an instruction code; (c) for each at least one program memory: (i) a code memory for storing a plurality of distinct instances of instructions, the instruction codes serving as bases for computing respective indices to the compressed instructions in the code memory, and (ii) a decompression mechanism for (A) extracting the instruction codes from the compressed instructions, (B) retrieving the instances from the code memory in accordance with the instruction codes, and (C) providing the instances to the processor for execution.

According to the present invention there is provided a computer readable storage medium having computer readable code embodied on the computer readable storage medium, the computer readable code for compressing a dataset that includes a plurality of distinct symbols having a common length, the computer readable code including: (a) program code for ranking the symbols by frequency, thereby assigning to each symbol a respective rank i; (b) program code for selecting a number Q of classes; (c) program code for selecting Q distinct class codes $c_j$ indexed by an index j gsuch that $1 \leq j \leq Q$; and (d) program code for: for each symbol: if the rank i of the each symbol is such that $2^{q-1} \leq i \leq 2^q - 1$ for an integer $q \leq Q$: (i) assigning the class code $c_q$ to the each symbol, (ii) assigning a respective symbol code to the each symbol, and (iii) replacing at least one occurrence of the each symbol in the dataset with a concatenation of $c_q$ and the symbol code of the each symbol, thereby providing a compressed dataset.

The method of the present invention is directed at compressing a dataset that includes N distinct symbols, all of equal length. First, the symbols are ranked by frequency, and each symbol is assigned a respective rank i, with i=1 being the rank of the most common symbol and i=N being the rank of the least common symbol. A number Q of classes to use is selected. The symbols ranked 1 through $2^Q - 1$ are encoded using a two part code that is a concatenation of a class code and a symbol code. There are Q class codes $\{c_j\}$, with the symbols ranked from $i = 2^{q-1}$ through $i = 2^q - 1$ being assigned to the q-th class and so receiving the class code $c_q$. Within each class, the symbol codes of the various symbols are unique. In one embodiment of the present invention, the class code of the j-th class is exactly j bits long. Preferably, however, the class codes are obtained by applying Huffman coding to the classes. Most preferably, the symbol codes of the j-th class, i.e., the symbol codes of the symbols that belong to the j-th class, are at most j−1 bits long. In the case of the first class, which contains only one symbol, this means that the symbol code of this symbol is a null code, i.e., that this symbol is encoded as only $c_1$.

If $N \geq 2^Q$, then each of the (unclassified) symbols ranked higher than $2^Q - 1$ is encoded as the concatenation of a literal class code and the symbol itself. Such symbols are termed "literals" herein.

A symbol codebook is constructed by storing one instance of each of the distinct uncompressed classified symbols, in rank order, in the first $2^Q - 1$ locations of a memory. The symbol codes of the classified symbols then serve as bases for computing respective indices of the instances within the memory. The compressed dataset, that is obtained by encoding the dataset as described above, is decompressed with reference to this symbol codebook.

A particular application of the method of the present invention is to the operation of a processor, in particular the processor of an embedded system-on-a-chip device, that is driven by instructions that are all of equal length. The dataset in this case is the program that the processor runs. The symbols are the instructions, so that in this application of the method of the present invention, the symbol codes are instruction codes, the symbol codebook is an instruction codebook, and the compressed instructions are concatenations of the class codes and the instruction codes. The program is stored in its compressed form. As the instructions are needed, they are decompressed individually with reference to the instruction codebook, and executed by the processor.

In the preferred case of 32-bit instructions split into instruction halves, the first halves and the second halves are treated as two different datasets and are compressed separately, with separate instruction codebooks.

A computer of the present invention includes a processor and at least one program memory for storing instructions that have been compressed using the method of the present invention. Associated with each program memory is a corresponding code memory, for storing distinct instances of the uncompressed instructions, that serves as an instruction codebook, and a corresponding decompression mechanism for decompressing the compressed instructions and providing the decompressed instructions to the processor for execution. In the preferred case of 32-bit instructions split into instruction halves, there are two such program memories, one for the first halves of the instructions and the other for the second halves of the instructions; and the computer also includes a concatenation mechanism for concatenating the decompressed first halves and the decompressed second halves to form complete decompressed instructions that then are sent to the processor to be executed.

Preferably, the decompression mechanism includes Q class code mask registers for comparing with the class codes of the compressed instructions. With each class code mask register is associated a class code interpretation register that includes a class base, a shift control and an instruction mask.

The scope of the present invention also includes a computer readable storage medium in which is embodied computer readable code for implementing the method of the present invention.

BRIEF DESCRIPTION OF THE DRAWINGS

The invention is herein described, by way of example only, with reference to the accompanying drawings, wherein:

FIG. 2 is a table of regression parameters for the SPEC2000 files;

FIG. 4 is a table of average code lengths of the present invention for the SPEC2000 files;

FIG. 5 is a table of differences from Huffman code lengths for the SPEC2000 files;

DESCRIPTION OF THE PREFERRED EMBODIMENTS

Figure 1:
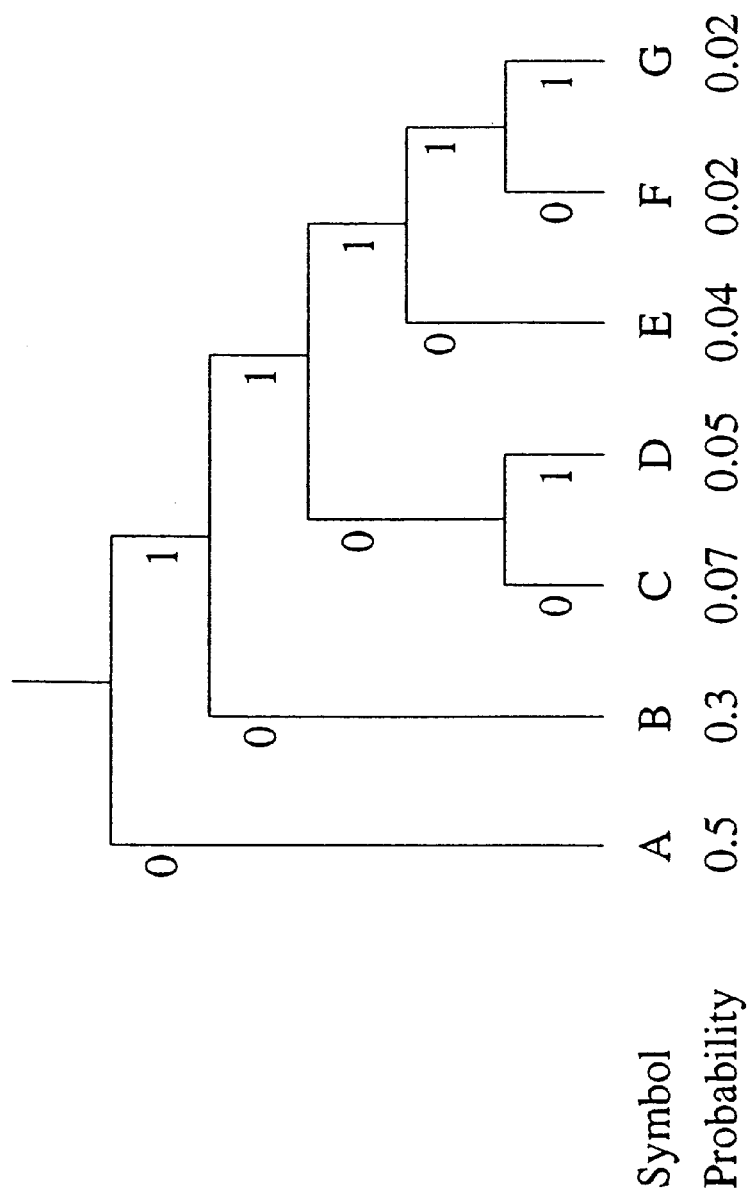
FIG. 1 (prior art) is an example of a Huffman tree.

The present invention is of an approximate prefix coding method for compressing and decompressing a dataset. Specifically, the present invention can be used to compress and decompress code for an embedded system-on-a-chip device.

The principles and operation of approximate prefix coding according to the present invention may be better understood with reference to the drawings and the accompanying description.

The code of the present invention is a Huffman-style approximate code. A class is a group of symbols that are assigned codes with the same length. Every symbol in the alphabet belongs to a single respective class. Every class is identified by a unique class code. The symbol code is appended to the class code to identify each symbol that belongs to that class. A code word consists of a class code followed by a symbol code. The terms "codeword" and "compressed symbol" are used interchangeably herein.

A class of literals, i.e., symbols whose contents is not changed by the coding process, also is defined. Literals are coded simply by attaching them to the class code. The class of literals includes the symbols that have the lowest frequencies.

Two codebooks are maintained: a class codebook and a symbol codebook. The symbol codebook contains decoding information for the symbols in all the classes except the class of literals, which consists of the remaining symbols. Because typically there are only a few classes, the class codebook is quite small. The term "codebook", without a qualifier, refers herein to the symbol codebook.

Decoding is a two phase process. First, the class code is decoded to produce the length of the symbol code and to determine whether the symbol is a literal. Then the symbol code is read. If the symbol is a literal, then the symbol code is the symbol itself. Otherwise, the symbol codebook is accessed to produce the symbol. Note that the terms "coding" and "compression" are used interchangeably herein; and that the terms "decoding" and "decompression" are used interchangeably herein.

The class code is a variable length prefix code. The symbol code length is a property of its class. The symbol code is a basis for computing an index into the symbol codebook. In the simplest case, the operation that transforms the symbol code into the corresponding symbol codebook index is the identity operation: the symbol code itself is the index.

The Alpha architecture (D. Bhandarkar, *Alpha Implementations and Architecture: Complete Reference and Guide*, Digital Press, March 1996) was selected as a representative of 32-bit fixed-length instruction set architectures. The 26 SPEC2000 programs were obtained as compiled Alpha binaries from C. T. Weaver, Spec 2000 Binaries, http://www.eecs.umich.edu/chriswea/benchmarks/spec2000.html, and were analyzed using regression analysis to serve as guides to partitioning the symbols of interest (32-bit fixed-length instructions) into classes.

Based on the work of Kemp et al., it was expected that compressing 16-bit instruction halves would give better results than compressing the files as sequences of 8-bit bytes. Therefore, the SPEC2000 binary files were treated as sequences of 16-bit instruction halves. A symbol is either a left instruction half including the opcode, or a right instruction half, which in immediate instructions is just a constant.

The number of symbol occurrences were counted separately for the two instruction halves, and the symbols were sorted in each file in decreasing frequency order. All the files exhibited similar statistics, typically with a few symbols topping the list and with a rapidly decreasing symbol count upon progressing down the list. When the symbol count is plotted as a function of the symbol index in the sorted file, the pattern appears to be close to linear on a log-log plot. This pattern is sufficiently regular that it can be estimated using a simple regression model:

$$\log_{10} f(i) = a \log_{10} i + b \tag{2}$$

where i is the symbol index in the sorted list in decreasing frequency order, f(i) is the symbol frequency, and a and b are the regression parameters. Note that the terms "symbol index" and "symbol rank" are used interchangeably herein.

Referring again to the drawings, FIG. 2 shows a table of the parameters a and b and the norms of the residuals for the 26 SPEC2000 files. The residual (or error) $r_i$ is the vertical distance between the observed point and the corresponding point on the regression model. The norm of residuals is the square root of the Sum of Squared Errors (SSE), which is defined as:

$$SSE = \sum_{i=1}^{n} r_i^2 \qquad (3)$$

Figure 3A:
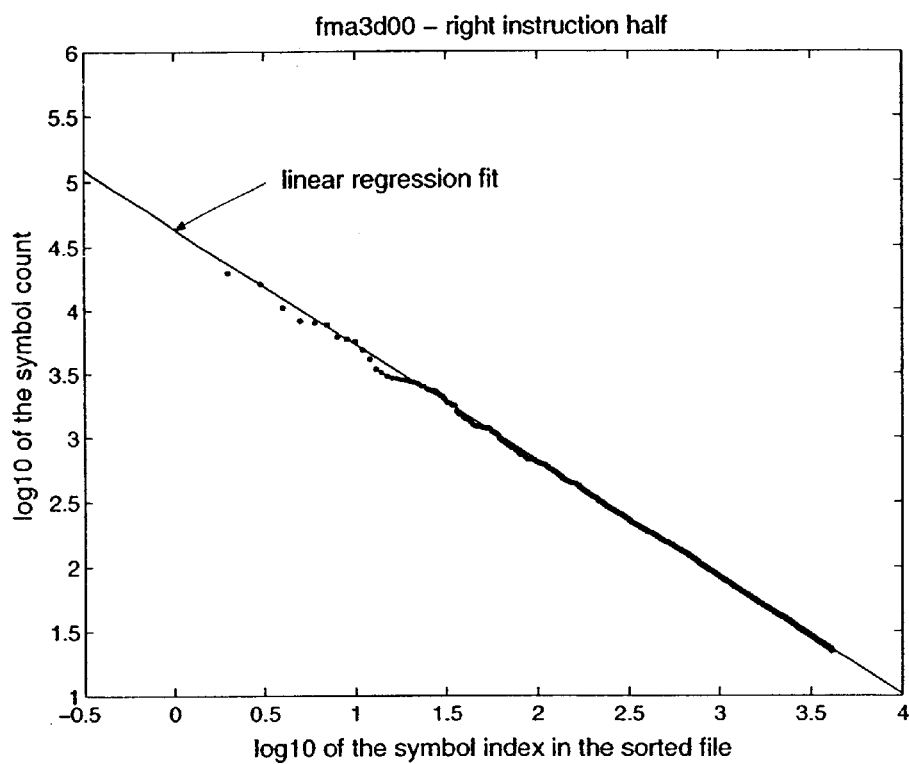
FIGS. 3A and 3B are plots of the best and worst regression fits for the SPEC2000 files.
Figure 3B:
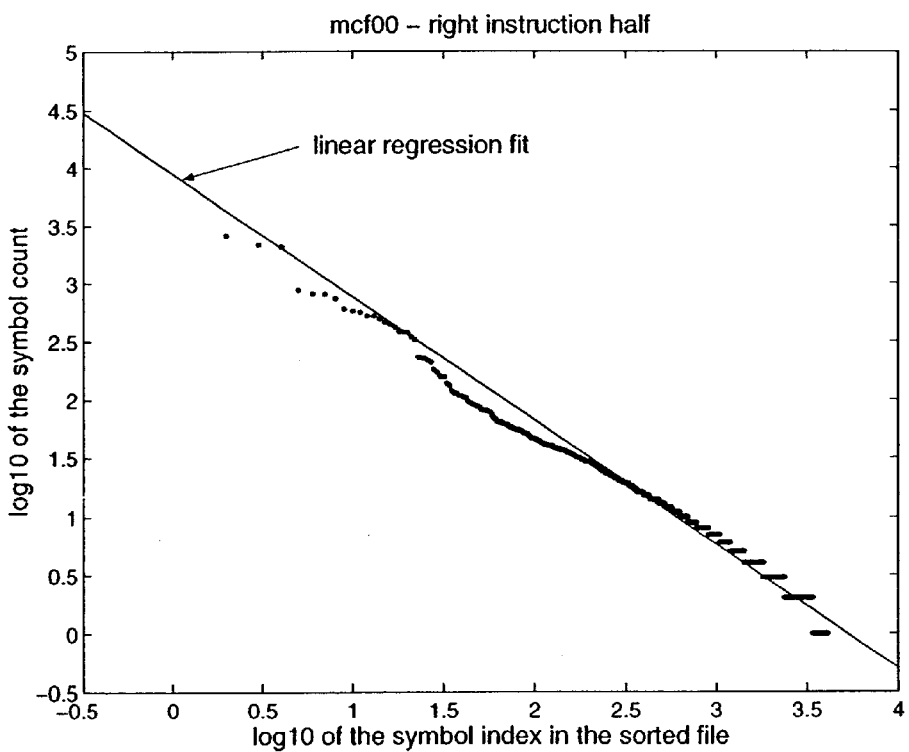

FIGS. 3A and 3B show the best and worst fits produced by the regression model. Because the abscissas are the base-10 logarithms of the symbol indices, the observation points are sparse at the left and become more dense at higher index values. The leftmost, high count symbols typically are off the fitted line, but contribute little to the norm of residuals simply because there are so few of them. In FIG. 3B, the large number of observation points in the middle of the plot, which are off the fitted line, contribute the most toward the large value of the norm of residuals.

Equation (2) can be written as:

$$f(i) = K/i^a \qquad (4)$$

where $K=10^b$. Considering that the values of a in FIG. 2 are close to −1, as a first order approximation the frequency f of symbol i can be expressed as:

$$f(i) = K/i \qquad (5)$$

Equation (5) suggests a partitioning of symbols into classes based on the sequence $2^0, 2^1, 2^2, \ldots, 2^{Q-1}$, where Q is the number of classes. The symbols are sorted in decreasing frequency order and assigned to classes in the same order, so that there are $2^{q-1}$ symbols in the q-th class, $1 \leq q \leq Q$. If $1 \leq i \leq 2^Q - 1$ is the symbol index in the sorted list, then the q-th class contains the symbols indexed $2^{q-1} \leq i \leq 2^q - 1$.

The frequency F(q) of class q is the total count of the symbol occurrences in that class:

$$F(q) = \sum_{i=2^{q-1}}^{2^q-1} f(i) \qquad (6)$$

Substituting f(i) from equation (5) gives:

$$F(q) = K \sum_{i=2^{q-1}}^{2^q-1} \frac{1}{i} \qquad (7)$$

It is easy to verify using the Taylor series expansions for logarithmic functions that $$\lim_{q \to \infty} \sum_{i=2^{q-1}}^{2^q-1} \frac{1}{i} = \ln 2 \approx 0.6931 \qquad (8)$$

This sum converges quite rapidly even for small values of q. For q=7, the sum is equal to ln 2 to two significant figures. For q=10, the sum is equal to ln 2 to three significant figures.

That the sum is identically equal to 1 for q=1, which gives F(1)=K, is of no concern because the first class includes only one symbol, and the assigned to the single symbol of the first class is the same as the Huffman code that symbol.

This class partitioning has the following properties:
1. The frequencies F(q) of all the classes are roughly the same.
2. The number of symbols in a class always is a power of 2.
3. With Q classes, and with $2^{q-1}$ symbols per class, the total number of classified symbols is $$\sum_{q=1}^{Q} 2^{q-1} = 2^Q - 1.$$

Therefore, the codebook memory (typically taining a power of two of bytes) is fully utilized, except for one empty location.

The following table shows an example of a set of eleven distinct symbols, their probabilities $p_i$, and their encoding according to the present invention with Q=3.

| i  | symbol | $p_i$ | class code | symbol code |
|----|--------|-------|------------|-------------|
| 1  | A      | 0.4   | 0          |             |
| 2  | B      | 0.2   | 10         | 0           |
| 3  | C      | 0.1   | 10         | 1           |
| 4  | D      | 0.08  | 110        | 00          |
| 5  | E      | 0.06  | 110        | 01          |
| 6  | F      | 0.05  | 110        | 10          |
| 7  | G      | 0.04  | 110        | 11          |
| 8  | H      | 0.03  | 111        | 0111        |
| 9  | I      | 0.02  | 111        | 1000        |
| 10 | J      | 0.01  | 111        | 1001        |
| 11 | K      | 0.01  | 111        | 1010        |

The uncompressed encoding of the symbols is a four-bit encoding as the binary resentation of i−1: A is 0000, B is 0001, etc. There are three classes. The first class, whose class code is "0", includes only the symbol "A". The second class, whose class code is "10", includes the two symbols "B" and "C". The third class, whose class code is "110", includes the four symbols "D", "E", "F" and "G". There are four unclassified symbols (literals): "H", "I", "J" and "K". From equation (1), the average code length $L_{av}$ is 2.94. The average length of the Huffman code for this example is 2.72, so that exact Huffman coding is not much more efficient in this case than this approximate Huffman coding.

The actual codes of the symbols are obtained by concatenating their class codes and symbol codes. For example, "B" is encoded as "100" and "J" is encoded as "1111001".

The class code of the q-th class is the binary representation of $2^q - 2$, except for the literal class, whose binary representation is a string of 1's. This makes it simple to decode a string that has been encoded according to this table, assuming that the decoding starts at a symbol boundary. Bits are read until either a zero bit is encountered or three bits have been read. At this point, the class code has been read. If the class code is one bit long (i.e., identically zero) then the symbol is "A". If the class code is q>1 bits long and ends in zero, then the next q−1 bits are the symbol code. If the class code is all "1"s then the next four bits are the symbol code.

The method of the present invention was used to compress the SPEC 2000 binary files. Each file was treated as two separate datasets, corresponding to the two instruction halves. Unlike in the simple example above, the class code for each class was obtained by applying the Huffman algorithm to classes. Except in the simplest cases, such as the above illustrative example, it is preferable to obtain the class codes by applying Hufftnan coding to the classes. Class codes obtained via Huffman coding of the classes are optimized relative to the statistics of the input dataset. In this sense, the method of the present invention supports programmable classes that are adapted to the characteristics of the input dataset.

The codebook memory size determines the number of symbols that are decoded using the codebook. The remaining symbols are decoded as literals. For example, if the codebook memory size is 2048 bytes, the codebook memory may contain up to 1024 symbols, at 16 bits (two bytes) per symbol. The codebook memory contains two codebooks, one for the left instruction halves and one for the right instruction halves. The first 511 left instruction halves are classified into nine classes (Q=9), as are the first 511 right instruction halves. This leaves one empty space in each codebook. The remaining instruction halves are literals.

FIG. 4 shows a table of average code lengths $L_{av}$, as defined in equation (1), for the 26 SPEC 2000 binary files and for the codebook memory sizes indicated. FIG. 5 shows a similar table that lists the excess $L_{av}$'s of the present invention over the Huffman code $L_{av}$'s. The median excess (normalized to the 16-bit length of the input symbols) is less than 0.13%, and the largest excess is no greater than 0.25%.

Figure 6:
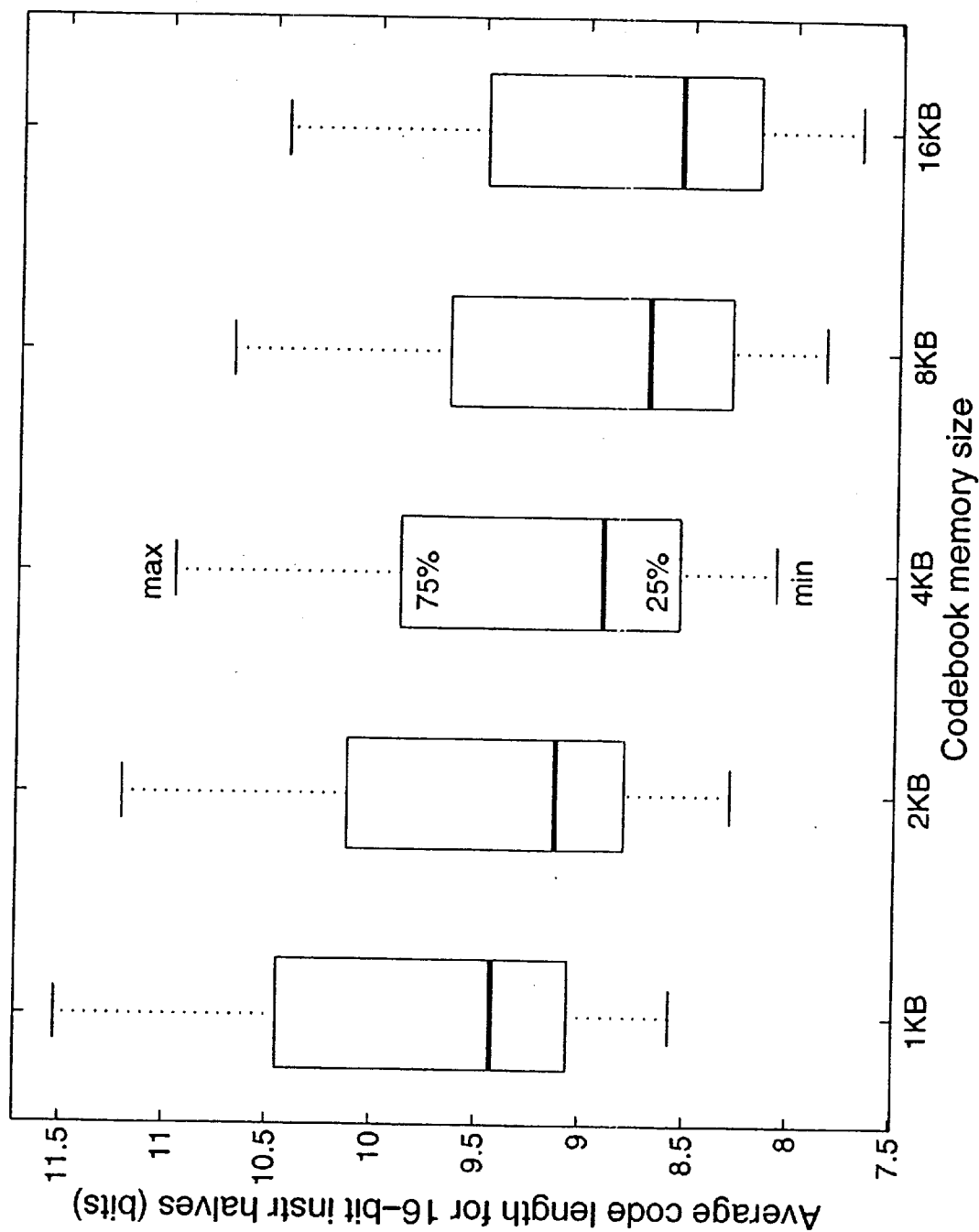
FIG. 6 illustrates the variability of code lengths of the present invention for the SPEC2000 files.
Figure 7:
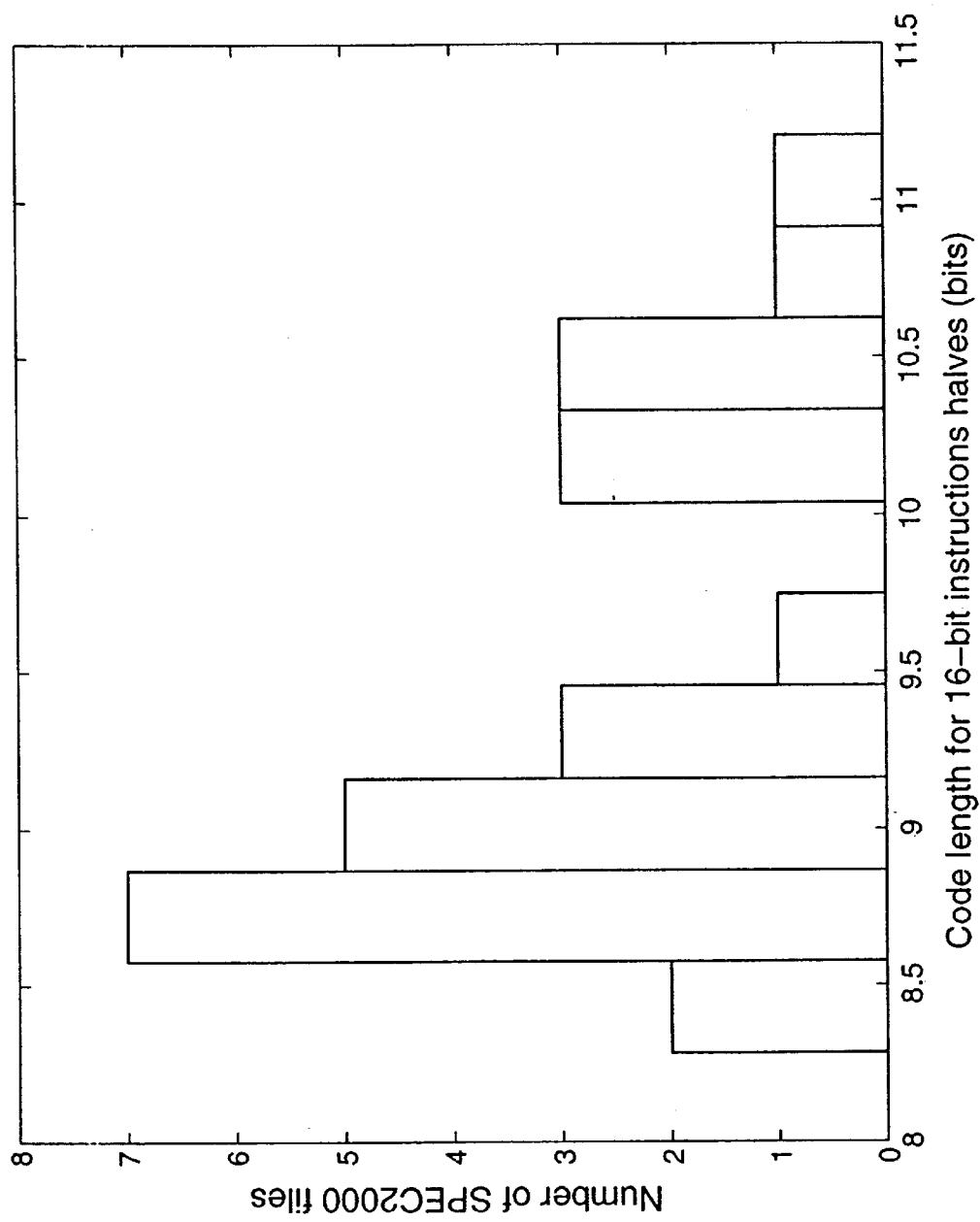
FIG. 7 is a histogram of average code lengths for one codebook memory size.

FIG. 6 illustrates the variability of $L_{av}$ of the present invention across the 26 SPEC 2000 binary files. Two measures of variability are shown. The first measure is the range between the minimum $L_{av}$ and the maximum $L_{av}$. For each codebook memory size, the values of $L_{av}$ are bounded in a range of about three bits, and there are no "outliers" far away from the typical values. The second measure is the first, second and third quartiles, $Q_1$, $Q_2$ and $Q_3$. Quartiles split the data so that 25% of the values of $L_{av}$ are less than or equal to $Q_1$, 50% of the values of $L_{av}$ are less than or equal to $Q_2$, and 25% of the values of $L_{av}$ are greater than or equal to $Q_3$. $Q_2$ also is the median. In the present case, the number of values (26) is even and the median is the average of the two values in the middle of the sorted list. If the distribution of values is skewed, then the median is a better indication of a typical value than the mean. FIG. 6 clearly shows that the distribution is in fact skewed. This is shown more clearly in FIG. 7, which is a histogram of $L_{av}$ for the 2 KB codebook memory.

Figure 8:
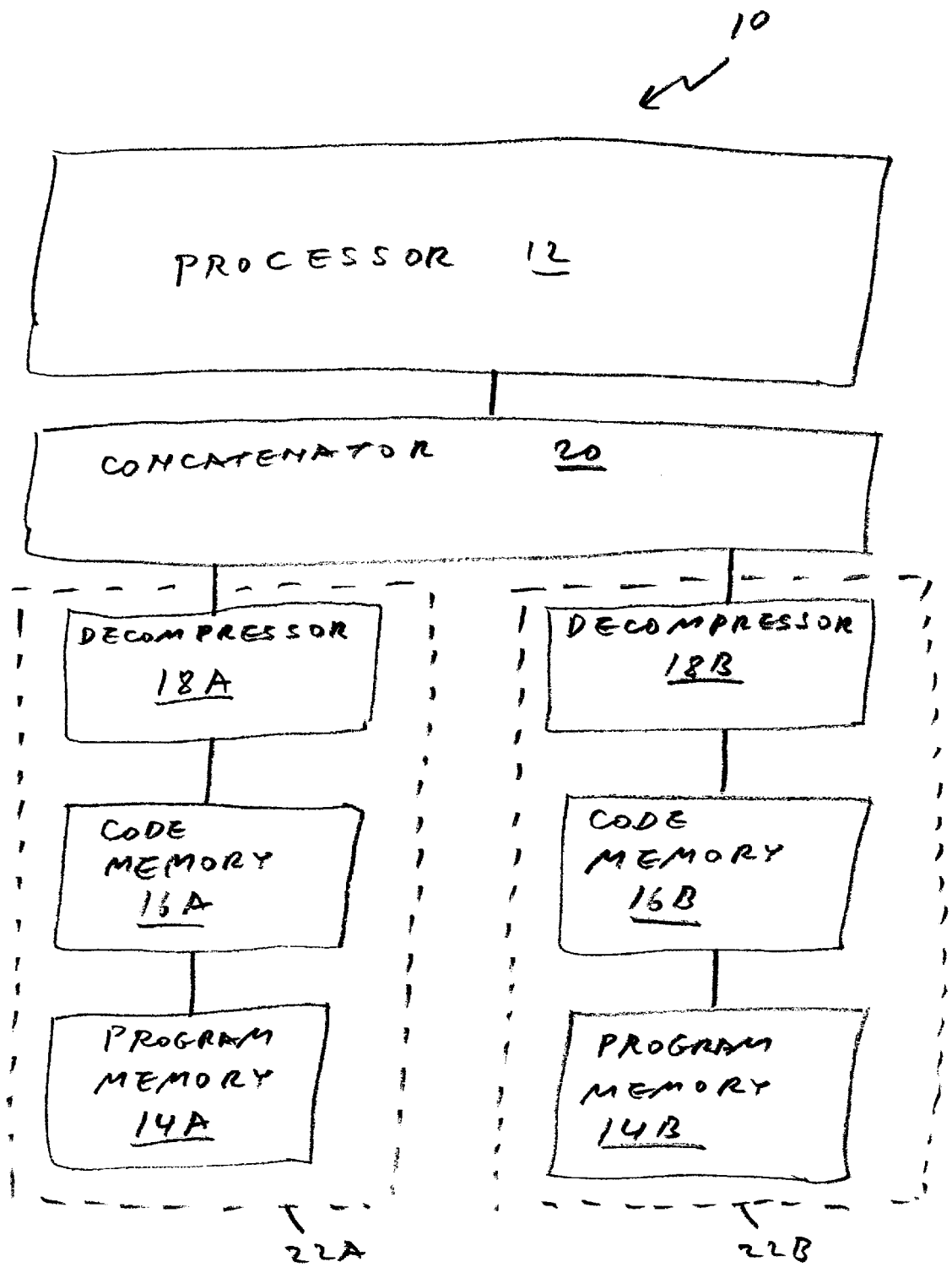
FIG. 8 is a partial schematic block diagram of a computer of the present invention.

FIG. 8 is a partial schematic block diagram of a computer 10 of the present invention. Typically, computer 10 is an embedded system-on-a chip device; but in principle computer 10 could be any computer in which, as in the old days, program memory is at a premium. Computer 10 includes a processor 12 and two instruction storage areas 22A and 22B for storing and decompressing the left (A) and right (B) halves of 32-bit instructions that have been compressed according to the teachings of the present invention. Each instruction storage area 22 includes a program memory 14 in which the compressed instruction halves are stored, a code memory 16 in which the codebook for decompressing the compressed instruction halves is stored, and a decompressor 18 for decompressing the compressed instruction halves. Computer 10 also includes a concatenator 20 that concatenates the decompressed left and right instruction halves to form a complete instruction that is executed by processor 12.

When processor 12 needs an instruction, decompressors 18 retrieve the compressed left and right halves of the instruction from program memories 14 and parse the compressed instruction halves into class codes and instruction codes. If a compressed instruction half is a classified instruction half then the respective decompressor 18 uses the instruction code to compute an index to the respective code memory 16 to obtain the decompressed instruction half. If a compressed instruction half is a literal instruction half then the instruction code itself is the decompressed instruction half. The two decompressed instruction halves are passed to concatenator 20 for concatenation and thence to processor 12 for execution.

To fetch an instruction, processor 12 issues the same address as would be issued to access uncompressed memory. This is true whether the desired instruction is the next instruction in sequence or an instruction after a taken branch. To locate instructions in compressed memory, an address translation table is used, as proposed by A. Wolfe and A. Chanin in "Executing compressed programs on an embedded RISC architecture", *Proc. 25th Annual Int'l Symposium on Microarchitecture*, 1992, pp. 81–91. Instructions are fetched from memories 14 and decompressed at run time.

Figure 9:
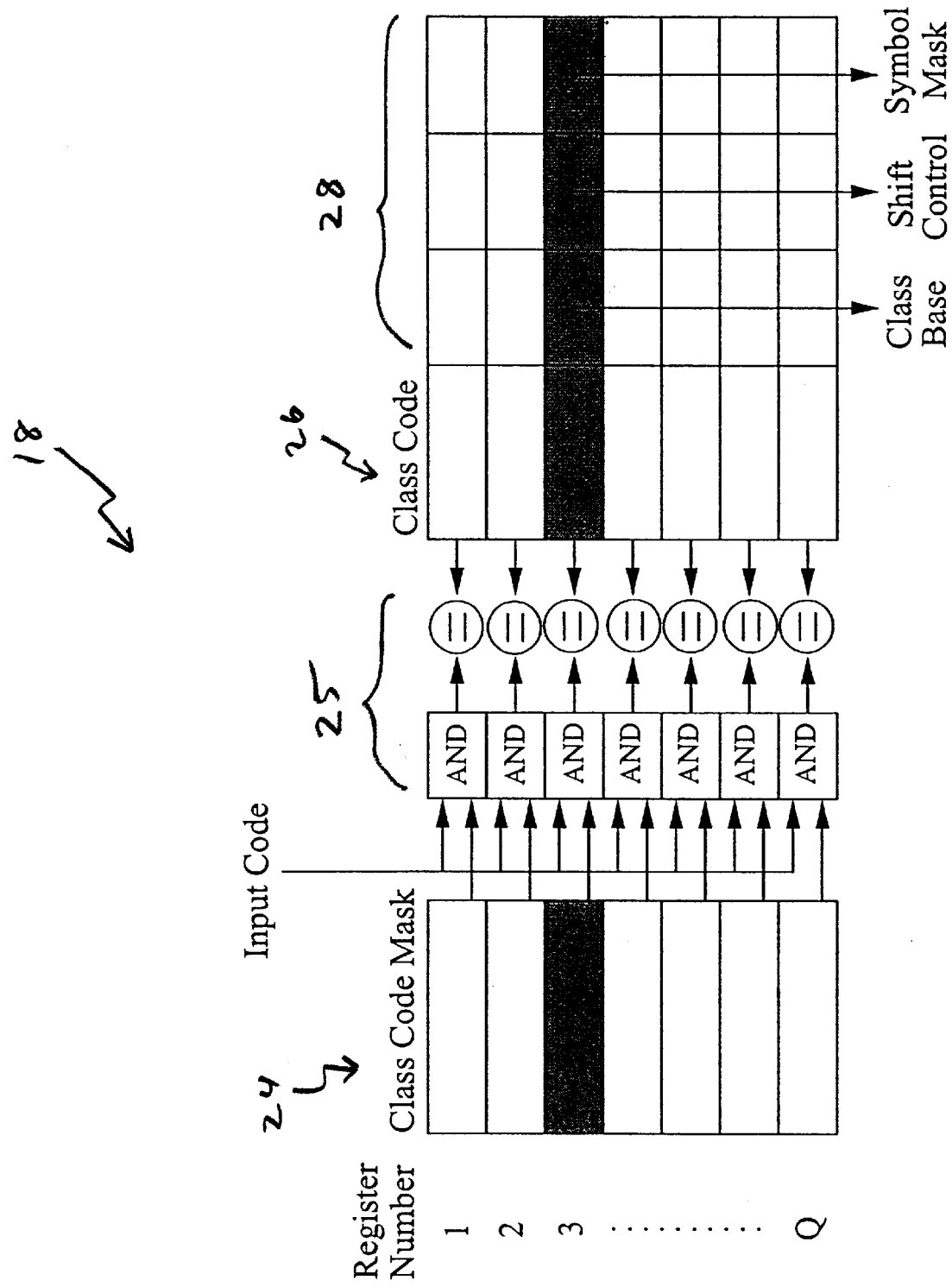
FIG. 9 is a partial schematic diagram of a decompressor.

FIG. 9 is a partial schematic diagram of a preferred decompressor 18. Decompressor 18 includes a set of Q class code mask registers 24, Q corresponding comparators 25, Q corresponding class code registers 26 and Q corresponding class code interpretation registers 28. Equivalently, the number of class code mask registers 24, comparators 25, class code registers 26 and class code interpretation registers 28 is determined by the size of code memory 16. Typical values of Q are from 8 to 12, corresponding to code memory 16 sizes from 0.5 KB to 8 KB.

For each integer $q \in [1,Q]$, the q-th class code mask register 24 is set to a sequence of $n_q$ ones, where $n_q$ is the length in bits of the corresponding class code. An input compressed instruction half is AND-ed with all class code mask registers 24 in the corresponding comparators 25. The results of each AND operation is compared with the corresponding class code register 26. Only the comparator 25 that is associated with the class code register 26 that matches the class code of the input compressed instruction half returns a "1" bit. The remaining comparators 25 return "0" bits. This is symbolized in FIG. 9 by the shading of one of class code mask registers 24 and the associated class code register 26 and class code interpretation register 28.

Each class code interpretation register 28 includes three fields: a class base, a shift control and a symbol mask. The class base is the codebook memory location of the first symbol of the class corresponding to the associated class code mask register 24. The shift control is used to shift out the class code bits from the input compressed instruction half. The symbol mask is used to mask out input bits that extend beyond the end of the instruction code. The instruction code is added to the class base to provide an index to code memory 16.

If comparator 25that corresponds to the literal class returns a "1" bit, then the input compressed instruction half is a literal, so that the encoded symbol is the symbol code portion of the input compressed instruction half.

Figure 10:
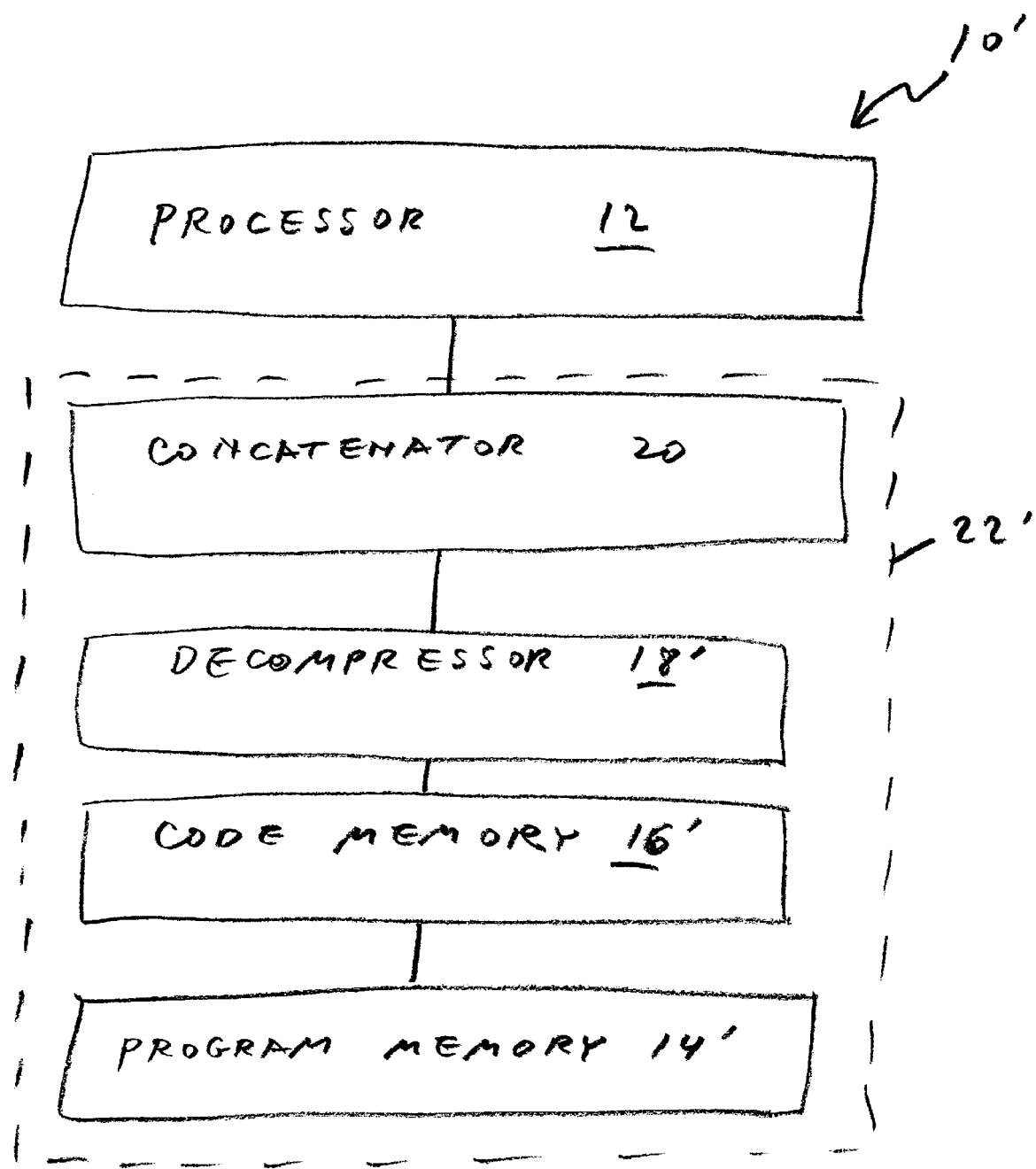
FIG. 10 is a partial schematic block diagram of another computer of the present invention.

FIG. 10 is a partial schematic block diagram of another computer 10' of the present invention. Like computer 10, computer 10' includes processor 12. Unlike computer 10, computer 10' includes only one instruction storage area 22' for storing and decompressing the left and right halves of 32-bit instructions that have been compressed according to the teachings of the present invention. Instruction storage area 22' includes a program memory 14' in which the compressed instruction halves are stored sequentially: the compressed left half of the first instruction, the compressed right half of the first instruction, the compressed left half of the second instruction, the compressed right half of the second instruction, etc. Instruction storage area 22' also includes a code memory 16' in which the codebook for decompressing the compressed instruction halves is stored, and a decompressor 18' for decompressing the compressed instruction halves. Like computer 10, computer 10' also includes concatenator 20 that concatenates the decompressed left and right instruction halves to form a complete instruction that is executed by processor 12.

While the invention has been described with respect to a limited number of embodiments, it will be appreciated that many variations, modifications and other applications of the invention may be made.

What is claimed is:

1. A method of compressing a dataset that includes a number N of distinct symbols, all of the symbols having a common length, comprising the steps of:
   (a) ranking the symbols by frequency, thereby assigning to each symbol a respective rank i;
   (b) selecting a number Q of classes;
   (c) selecting Q distinct class codes $c_j$ indexed by an index j such that $1 \leq j \leq Q$; and
   (d) for each symbol: if said rank i of said each symbol is such that $2^{q-1} \leq i \leq 2^q - 1$ for an integer $q \leq Q$:
      (i) assigning said class code $c_q$ to said each symbol, thereby classifying said each symbol according to a successive-powers-of-two class size scheme,
      (ii) assigning a respective symbol code to said each symbol, and
      (iii) replacing at least one occurrence of said each symbol in the dataset with a concatenation of $c_q$ and said symbol code of said each symbol, thereby providing a compressed dataset.

2. The method of claim 1, wherein, for each symbol whose rank i is such that $2^{q-1} \leq i \leq 2^q - 1$ for said integer q, every occurrence of said each symbol in the dataset is replaced with said concatenation of $c_q$ and said symbol code of said each symbol to provide said compressed dataset.

3. The method of claim 1, wherein $2^Q - 1 < N$, the method further comprising the steps of:
   (e) for each symbol: if said rank i of said each symbol exceeds $2^Q - 1$:
      (i) assigning a literal class code to said each symbol; and
      (ii) replacing at least one occurrence of said each symbol in the dataset with a concatenation of said literal class code and said each symbol.

4. The method of claim 3, wherein, for each symbol whose rank i exceeds $2^Q - 1$, every occurrence of said each symbol in the dataset is replaced with a concatenation of said literal class code and said each symbol.

5. The method of claim 1, wherein each $c_j$ is j bits long.

6. The method of claim 1, wherein said class codes are obtained by applying Huffman coding to said classes.

7. The method of claim 1, wherein, for each said class, said symbol codes of said each class are at most j-1 bits long, where j is said index of said each class.

8. The method of claim 7, further comprising the step of:
   (e) storing one instance of each of the distinct symbols, said rank whereof is less than $2^Q$, in $2^Q - 1$ consecutive locations of a memory.

9. The method of claim 8, wherein said instances of the symbols are stored in order of increasing said rank, so that said symbol codes serve as bases for computing respective indices of said instances of the symbols within said memory.

10. The method of claim 9, further comprising the step of:
    (f) decompressing said compressed dataset with reference to said memory.

11. A method of operating a processor, comprising the steps of:
    (a) providing a program that includes a plurality of distinct instructions, all of said instructions having a common length;
    (b) ranking said instructions by frequency, thereby assigning to each said instruction a respective rank i;
    (c) selecting a number Q of classes;
    (d) selecting Q distinct class codes $c_j$ indexed by an index j such that $1 \leq j \leq Q$;
    (e) for each said instruction: if said rank i of said each instruction is such that $2^{q-1} \leq i \leq 2^q - 1$ for an integer $q \leq Q$:
       (i) assigning said class code $c_q$ to said each instruction, thereby classifying said each instruction according to a successive-powers-of-two class size scheme,
       (ii) assigning a respective instruction code to said each instruction, and
       (iii) replacing at least one occurrence of said each instruction in the program with a concatenation of $c_q$ and said instruction code of said each instruction, thereby providing a compressed program;
    (f) storing said compressed program in a program memory;
    (g) for at least one said concatenation:
       (i) retrieving said concatenation from said program memory,
       (ii) decompressing said concatenation, thereby providing a decompressed instruction, and
       (iii) executing said decompressed instruction, using said processor.

12. The method of claim 11, wherein, for each said instruction whose rank i is such that $2^{q-1}23 \ i \leq 2^q - 1$ for said integer q, every occurrence of said each instruction in the program is replaced with a concatenation of $c_q$ and said instruction code of said each instruction to provide said compressed program.

13. The method of claim 11, wherein, for each said class, said instruction codes of said each class are at most j-1 bits long, where j is said index of said each class.

14. The method of claim 13, further comprising the steps of:
    (h) storing one instance of each of said distinct instructions, said rank whereof is less than $2^Q$, in $2^Q - 1$ consecutive locations of a code memory.

15. The method of claim 14, wherein said instances of the instructions are stored in order of increasing said rank, so that said instruction codes serve as bases for computing respective indices of said instances of said instructions within said code memory.

16. The method of claim 15, wherein said decompressing is effected with reference to said code memory.

17. A computer, comprising:
    (a) a processor;
    (b) at least one program memory for storing a plurality of compressed instructions, each said compressed instruction including an instruction code;
    (c) for each said at least one program memory:
       (i) a code memory for storing a plurality of distinct instances of instructions, said instruction codes serving as bases for computing respective indices to said compressed instructions in said code memory, and (ii) a decompression mechanism for
  (A) extracting said instruction codes from said compressed instructions,
  (B) retrieving said instances from said code memory in accordance with said instruction codes, and
  (C) providing said instances to said processor for execution.

18. The computer of claim 17, further comprising:
  (d) a concatenation mechanism for concatenating pairs of said retrieved instances prior to said providing of said instances to said processor for execution.

19. The computer of claim 18, comprising two said program memories and two respective said code memories, with, for each said pair of retrieved instances, a first instance of said each pair of retrieved instances being retrieved from a first said code memory and a second instance of said each pair of retrieved instances being retrieved from a second said code memory.

20. The computer of claim 17, wherein each said compressed instruction also includes a class code, and wherein said decompression mechanism includes:
  (A) a plurality of class code registers, for comparing with said class codes; and
  (B) for each said class code register, a respective class code interpretation register including:
    (I) a class base,
    (II) a shift control, and
    (III) an instruction mask;

said retrieving, for each said compressed instruction, being in accordance with said class code interpretation register whose class code mask register matches said class code of said each compressed instruction.

21. A computer readable storage medium having computer readable code embodied on the computer readable storage medium, the computer readable code for compressing a dataset that includes a plurality of distinct symbols having a common length, the computer readable code comprising:
  (a) program code for ranking the symbols by frequency, thereby assigning to each symbol a respective rank i;
  (b) program code for selecting a number Q of classes;
  (c) program code for selecting Q distinct class codes $c_j$ indexed by an index j such that $1 \leq j \leq Q$; and
  (d) program code for: for each symbol: if said rank i of said each symbol is such that $2^{q-1} \leq i \leq 2^q - 1$ for an integer $q \leq Q$:
    (i) assigning said class code $c_q$ to said each symbol. thereby classifying said each symbol according to a successive-powers-of-two class size scheme,
    (ii) assigning a respective symbol code to said each symbol, and
    (iii) replacing at least one occurrence of said each symbol in the dataset with a concatenation of $c_q$ and said symbol code of said each symbol, thereby providing a compressed dataset.

* * * * *